(12) United States Patent
Tseng et al.

(10) Patent No.: US 8,716,871 B2
(45) Date of Patent: May 6, 2014

(54) BIG VIA STRUCTURE

(75) Inventors: Uway Tseng, Dong-Shi (TW); Shu-Hui Su, Tucheng (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/397,488

(22) Filed: Feb. 15, 2012

(65) Prior Publication Data

US 2013/0207276 A1  Aug. 15, 2013

(51) Int. Cl.
*H01L 23/485* (2006.01)
*H01L 21/768* (2006.01)

(52) U.S. Cl.
USPC ............ 257/774; 257/E23.02; 257/E23.141; 257/E23.142; 257/E21.585; 257/E31.113; 257/773; 257/758; 257/700; 257/701; 257/459; 257/750; 438/612

(58) Field of Classification Search
USPC .......... 257/774, E23.141, E21.495, 773, 758, 257/700, 701, E23.142, 459, 750, E23.01, 257/E31.113, E23.02, E21.585; 438/612
See application file for complete search history.

(56) References Cited

U.S. PATENT DOCUMENTS

| | | | | |
|---|---|---|---|---|
| 6,511,922 | B2* | 1/2003 | Krishnaraj et al. | 438/778 |
| 6,737,345 | B1* | 5/2004 | Lin et al. | 438/601 |
| 7,566,658 | B2* | 7/2009 | Keum | 438/668 |
| 8,013,423 | B2* | 9/2011 | Keum | 257/577 |
| 8,358,011 | B1* | 1/2013 | Colburn et al. | 257/774 |
| 2008/0048332 | A1* | 2/2008 | Park | 257/773 |
| 2008/0173981 | A1* | 7/2008 | Chinthakindi et al. | 257/535 |
| 2009/0102052 | A1* | 4/2009 | Ryu | 257/751 |
| 2009/0212439 | A1* | 8/2009 | Farooq et al. | 257/773 |
| 2009/0261475 | A1* | 10/2009 | Keum | 257/758 |
| 2011/0024866 | A1 | 2/2011 | Tseng et al. | |
| 2011/0281432 | A1* | 11/2011 | Farooq et al. | 438/624 |

\* cited by examiner

*Primary Examiner* — Alexander Oscar Williams
(74) *Attorney, Agent, or Firm* — Haynes and Boone, LLP

(57) ABSTRACT

A semiconductor device that includes a first metal layer component formed over a substrate. The semiconductor device includes a via formed over the first metal layer component. The via has a recessed shape. The semiconductor device includes a second metal layer component formed over the via. The semiconductor device includes a first dielectric layer component formed over the substrate. The first dielectric layer component is located adjacent to, and partially over, the first metal layer component. The first dielectric layer component contains fluorine. The semiconductor device includes a second dielectric layer component formed over the first dielectric layer component. The first dielectric layer component and the second dielectric layer component are each located adjacent to the via. The second dielectric layer component is free of fluorine.

20 Claims, 5 Drawing Sheets

BIG VIA STRUCTURE

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

Metal pads, such as probe pads or wire bonding pads, have been used for various IC applications. In order to perform its functions properly, a metal pad should have sufficient size and strength to withstand physical stress due to such actions as probing or wire bonding. However, the ever-decreasing geometry size of ICs has dictated the shrinking of metal pads too, and often traditional metal pads may suffer from problems such as difficulty in bonding with bonding wires, peeling, or cracking in layers below the metal pads. To address some of these issues, a big via (many times larger than a regular via) can be used to provide support for a metal pad. Nevertheless, existing processes of forming such big vias may have certain drawbacks. For example, due to severe dishing or polishing erosion effects, existing processes to form big vias may lead to passivation bubbles, which may result in device defects.

Therefore, while existing methods of forming big vias have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
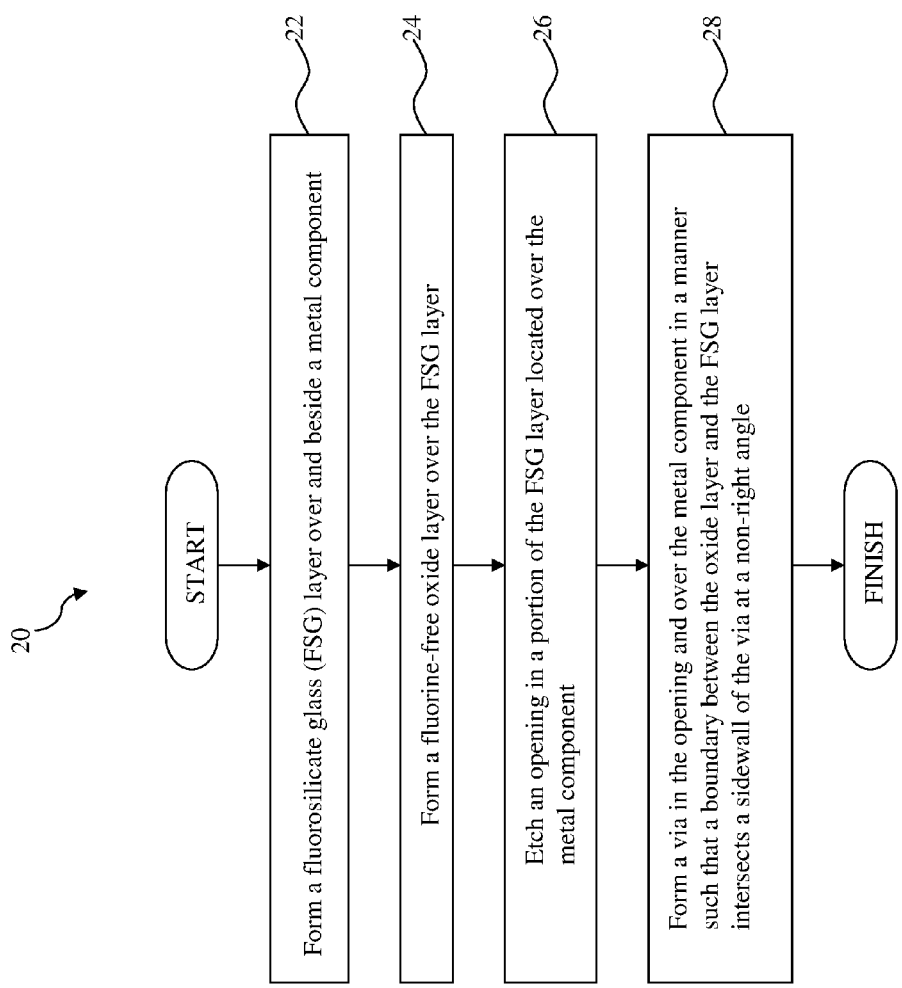
FIG. 1 is a flowchart illustrating a method of fabricating a semiconductor device according to various aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a flowchart of a method 20 for fabricating a semiconductor device. The method 20 begins with block 22 in which a fluorosilicate glass (FSG) layer is formed over and beside a metal component. The FSG layer may be formed using a high-density plasma deposition process. The method 20 continues with block 24 in which a fluorine-free oxide layer is formed over the FSG layer. In some embodiments, the oxide layer is formed using a plasma-enhanced deposition process. The method 20 continues with block 26 in which an opening is etched in a portion of the FSG layer located over the metal component. The method 20 continues with block 28 in which a via is formed in the opening and over the metal component in a manner such that a boundary between the oxide layer and the FSG layer intersects a sidewall of the via at a non-right angle.

FIGS. 2-5 are diagrammatic fragmentary cross-sectional side views of a semiconductor device 40 at various stages of fabrication in accordance with various aspects of the present disclosure. It is understood that FIGS. 2-5 have been simplified for a better understanding of the inventive concepts of the present disclosure. Accordingly, it should be noted that additional processes may be provided before, during, and after the processes shown in FIGS. 2-5, and that some other processes may only be briefly described herein.

Figure 2:
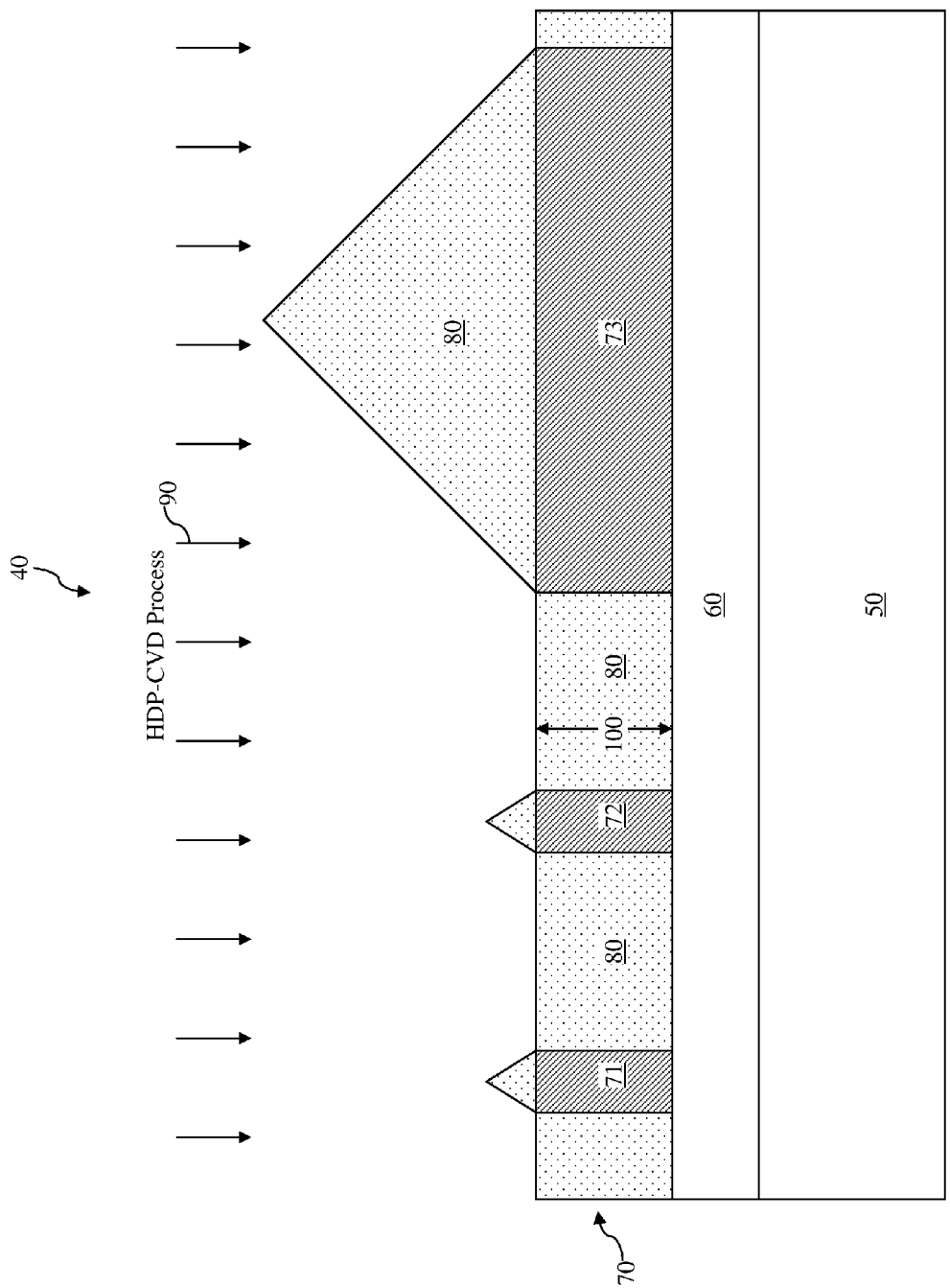
FIGS. 2-5 are diagrammatic fragmentary cross-sectional side views of a semiconductor device at various stages of fabrication in accordance with various aspects of the present disclosure.

Referring to FIG. 2, the semiconductor device 40 may be a semiconductor Integrated Circuit (IC) chip, system on chip (SoC), or portion thereof, that may include memory circuits, logic circuits, high frequency circuits, image sensors, and various passive and active components such as resistors, capacitors, and inductors, P-channel field effect transistors (pFET), N-channel FET (nFET), metal-oxide semiconductor field effect transistors (MOSFET), or complementary metal-oxide semiconductor (CMOS) transistors, bipolar junction transistors (BJT), laterally diffused MOS (LDMOS) transistors, high power MOS transistors, or other types of transistors. It should be noted that some features of the semiconductor device 40 may be fabricated with a CMOS process flow.

The semiconductor device 40 includes a substrate 50. In the embodiment shown, the substrate 50 is a silicon substrate that is doped with a P-type dopant such as boron. In another embodiment, the substrate 50 is a silicon substrate that is doped with an N-type dopant such as arsenic or phosphorous. The substrate may alternatively be made of some other suitable elementary semiconductor material, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. Further, in some embodiments, the substrate 50 could include an epitaxial layer (epi layer), may be strained for performance enhancement, and may include a silicon-on-insulator (SOI) structure.

Isolation structures are formed in the substrate 50. In some embodiments, the isolation structures include shallow trench isolation (STI) devices. The STI devices contain a dielectric material, which may be silicon oxide, silicon nitride, silicon oxy-nitride, fluoride-doped silicate (FSG), and/or a low-k dielectric material known in the art. The STI devices are formed by etching trenches in the substrate 50 and thereafter filling the trenches with the dielectric material. In other embodiments, deep trench isolation (DTI) devices may also be formed in place of (or in combination with) the STI devices as the isolation structures. For reasons of simplicity, the isolation structures are not specifically herein.

A plurality of microelectronic components is also formed in the substrate. For example, source and drain regions of FET transistor devices may be formed in the substrate 50 by one or more ion implantation and/or diffusion processes. As another example, radiation-sensitive image pixels may be formed in the substrate 50. For reasons of simplicity, these microelectronic components are not specifically herein either.

An interconnect structure is formed over the upper surface of the substrate 50. The interconnect structure includes a plurality of patterned dielectric layers and interconnected conductive layers. These interconnected conductive layers provide interconnections (e.g., wiring) between circuitries, inputs/outputs, and various doped features formed in the substrate 50. In more detail, the interconnect structure may include a plurality of interconnect layers, also referred to as metal layers (e.g., M1, M2, M3, etc). Each of the interconnect layers includes a plurality of interconnect features, also referred to as metal lines. The metal lines may be aluminum interconnect lines or copper interconnect lines, and may include conductive materials such as aluminum, copper, aluminum alloy, copper alloy, aluminum/silicon/copper alloy, titanium, titanium nitride, tantalum, tantalum nitride, tungsten, polysilicon, metal silicide, or combinations thereof. The metal lines may be formed by a process including physical vapor deposition (PVD), chemical vapor deposition (CVD), sputtering, plating, or combinations thereof.

The interconnect structure includes an interlayer dielectric (ILD) that provides isolation between the interconnect layers. The ILD may include a dielectric material such as an oxide material. The interconnect structure also includes a plurality of vias/contacts that provide electrical connections between the different interconnect layers and/or the features on the substrate. In the following paragraphs, the processes used to form some of the metal layers and their interconnecting vias will be discussed in more detail.

As shown in FIG. 2, a substantial portion of the interconnect structure is illustrated simply as a layer 60. The layer 60 may include a plurality of metal layers and vias as discussed above. A metal layer 70 (of the interconnect structure) is formed over the layer 60. The metal layer 70 contains a plurality of metal components, of which metal components 71, 72, and 73 are illustrated herein as examples. The metal components 71-73 may include one or more metal or metal alloy features.

A dielectric layer 80 is then formed over the metal components 71-73. The dielectric layer 80 contains a Fluorosilicate Glass (FSG) material in the present embodiment, but may include suitable alternative materials in other embodiments. The FSG material has a dielectric constant that is about 3.5. The dielectric layer 80 is formed by a High-Density Plasma Chemical Vapor Deposition (HDP-CVD) process 90. The HDP-CVD process 90 is capable of performing deposition and etching at the same time. Thus, as a result of the HDP-CVD process 90, the dielectric layer 80 has an uneven upper surface. In the illustrated embodiment, the upper surface of the dielectric layer 80 may have sloped cross-sectional profiles, such as the somewhat angular profiles for the portions thereof formed over the metal components 71-73. The dielectric layer 80 has a thickness 100. In some embodiments, the thickness 100 is in a range from about 4000 Angstroms to about 8000 Angstroms.

Figure 3:
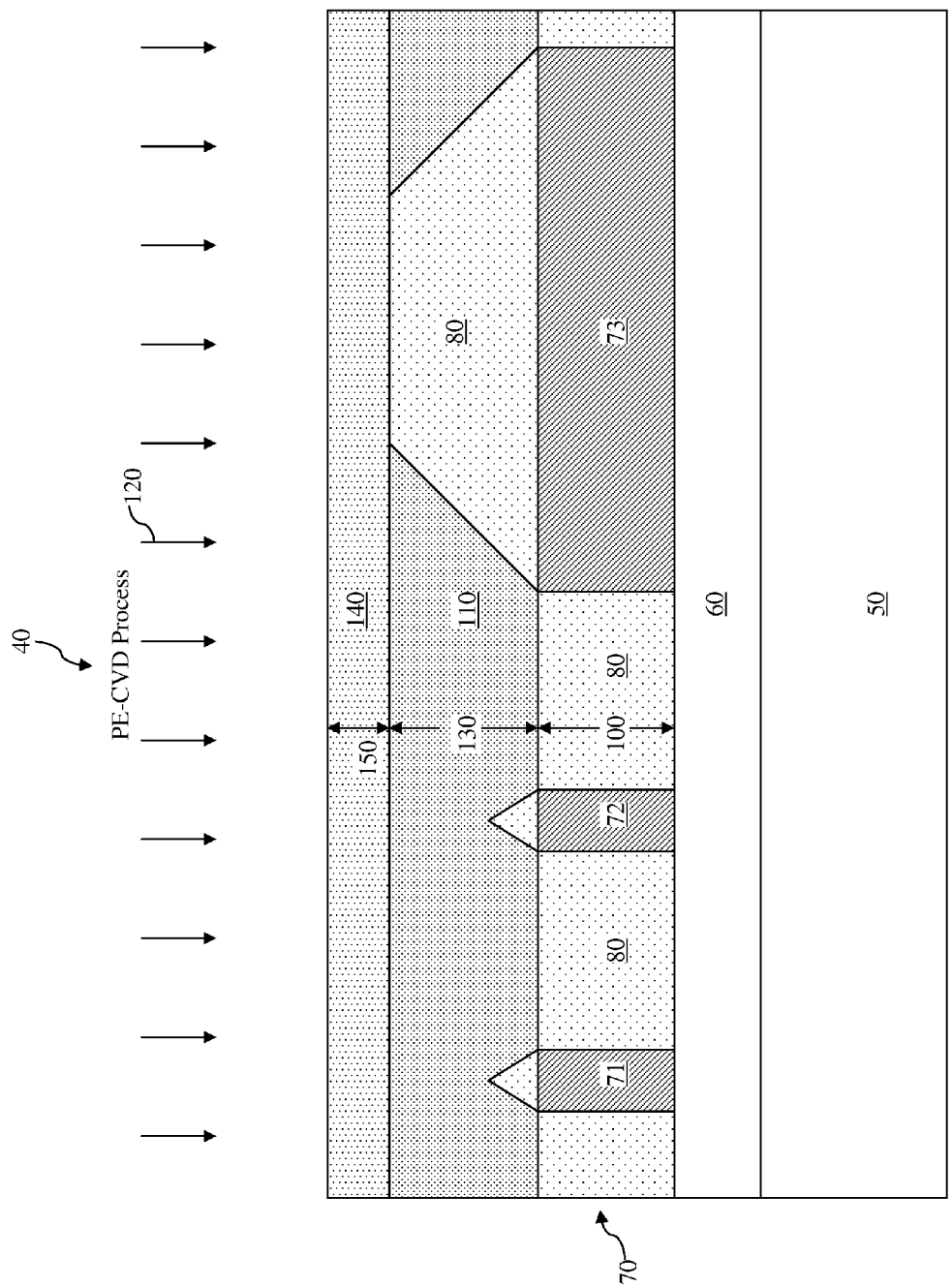

Referring now to FIG. 3, a dielectric layer 110 is then formed over the dielectric layer 80. The dielectric layer 110 contains a different material than the dielectric layer 80 and is free of fluorine. In the present embodiment, the dielectric layer 110 contains an Undoped Silicate Glass (USG) material, but it may include suitable alternative materials in other embodiments. The USG material has a dielectric constant that is about 3.9. The dielectric layer 110 is formed by a Plasma Enhanced Chemical Vapor Deposition (PE-CVD) process 120. The dielectric layer 110 is then polished along with the dielectric layer 80 in a suitable polishing process, for example a chemical-mechanical-polishing (CMP) process known in the art. After the polishing process is performed, the dielectric layers 80 and 110 are substantially co-planar (a portion of the dielectric layer overlying the metal component 73 has been polished away), and the dielectric layer 110 has a thickness 130. In some embodiments, the thickness 130 is in a range from about 4000 Angstroms to about 10000 Angstroms.

Thereafter, another dielectric layer 140 is formed over the planarized surfaces of the dielectric layer 80 and the dielectric layer 110. The dielectric layer 140 serves as a passivation layer for the layers underneath. In the present embodiment, the dielectric layer 140 contains an USG material, but it may include alternative suitable materials in other embodiments. The dielectric layer 140 has a thickness 150. In some embodiments, the thickness 150 is in a range from about 1000 Angstroms to about 6000 Angstroms.

Figure 4:
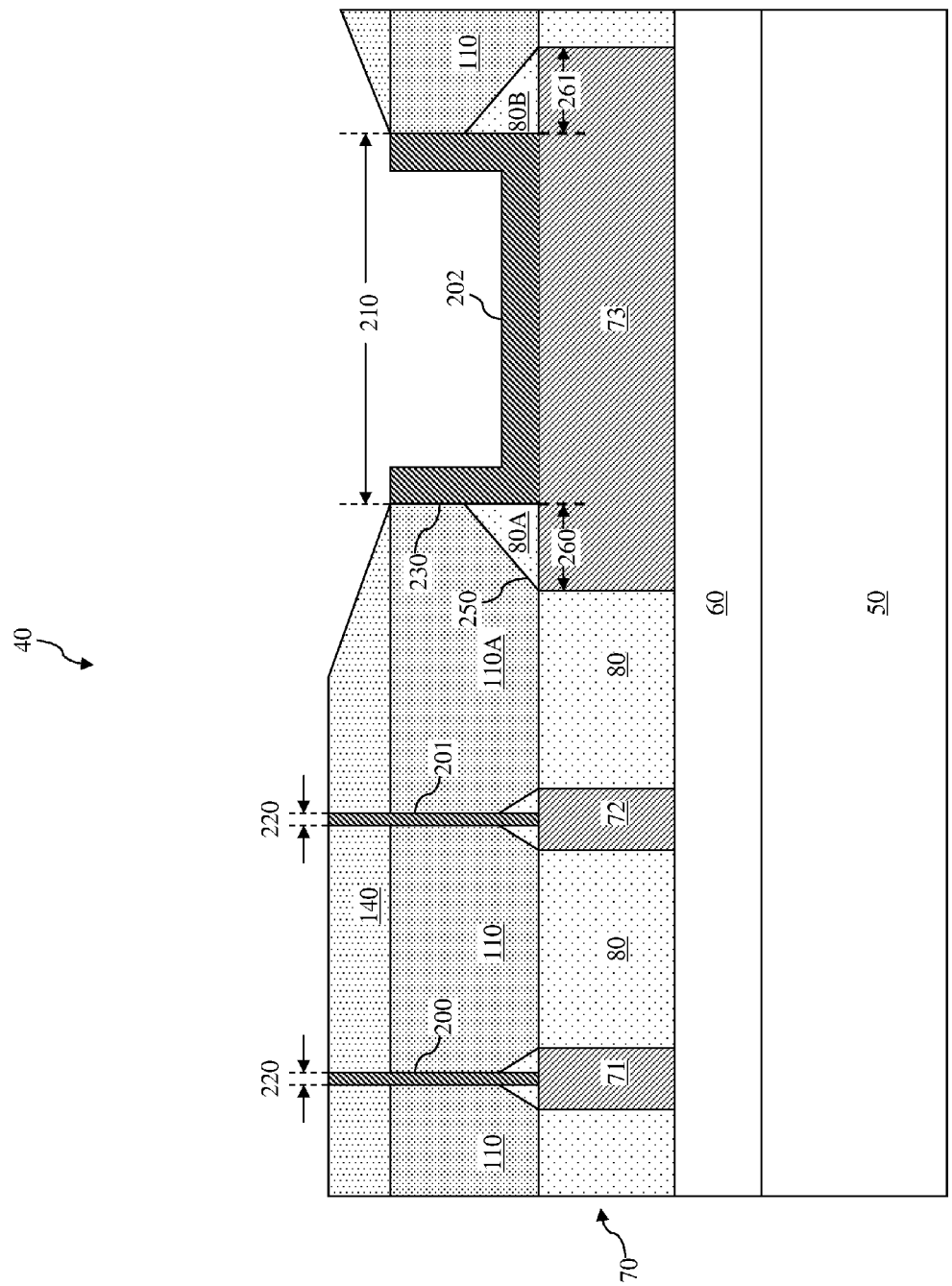

Referring now to FIG. 4, a plurality of conductive vias are formed in the dielectric layer 110, of which the vias 200, 201, and 202 are shown herein as examples. The vias 200-202 are formed by etching openings in the dielectric layers 110 and 140 and thereafter depositing a metal material to fill these openings. In the present embodiment, Tungsten (W) is used as the metal material to fill the openings, and therefore the vias 200-202 are Tungsten vias in the present embodiments. In alternative embodiments, other suitable metal materials may be used to form the vias 200-202. A polishing process such as a CMP process is then performed to planarize the vias 200-202.

The vias 200-202 are formed on the metal components 71-73, respectively. The vias 200-201 may be referred to as "small" or "regular" vias, and the via 202 may be referred to as a "big" via. As is shown in FIG. 4, the "big" via 202 has a lateral (or horizontal) dimension 210 that is substantially greater than a lateral (or horizontal) dimension 220 of the "small" vias 200-201. For example, the lateral dimension 210 may be tens or hundreds of times greater than the lateral dimension 220. In some embodiments, the lateral dimension 210 of the big via 202 may be in a range from about 30 microns to about 200 microns, whereas the lateral dimension 220 of the small vias 200-201 may be in a range from about 0.1 microns to about 0.5 microns. In other embodiments, these ranges may be varied depending on design requirements and manufacturing concerns.

The big via 202 has a vertically-extending sidewall 230. The sidewall 230 also defines some of the boundaries for a dielectric layer component 110A and a dielectric layer component 80A both located adjacent thereto. The dielectric layer component 110A and the dielectric layer component 80A also share a boundary 250. The sidewall 230 of the big via 202 spans across the boundary 250. In other words, the boundary 250 intersects the sidewall 230 at a point on the sidewall 230 that is not at the top or the bottom of the sidewall 230. In some embodiments, the various fabrication processes discussed above may be tuned in a manner such that the intersection point between the boundary 250 and the sidewall 230 is located within a predetermined distance away from the midpoint of the sidewall 230.

Also, as discussed above, due to the characteristics of the HDP-CVD process 90 (shown in FIG. 2) used to form the dielectric layer 80, the dielectric layer component 80A has a sloped cross-sectional profile. As such, the boundary 250 between the dielectric layer components 80A and 110A intersects the sidewall 230 at a non-right angle.

As is shown in FIG. 4, the metal component 73 (on which the big via 202 is formed) is wider than the big via 202 in a lateral or horizontal dimension. The edges of the big via 202 (e.g., the sidewall 230) are spaced apart from the respective edge of the metal component 73 by distances 260 and 261. In some embodiments, the fabrication processes used to form the big via 202 may also be tuned in a manner such that the big via 202 is centered with respect to the metal component 73 located underneath. Alternatively stated, the distances 260 and 261 are substantially equal, so that the big via 202 is not "offset" in either horizontal direction with respect to the metal component 73. The distances 260-261 are relatively small numbers, for example less than about 1 micron. In some embodiments, the distances 260-261 may be in a range from about 0.1 micron to about 0.5 microns. The small distances 260-261 may also be referred to as an overlay requirement between the big via 202 and the metal component 73.

Many conventional fabrication processes used to form the big via may utilize a FSG material as a dielectric material to separate the big via from the regular vias. However, as discussed above, the severe dishing effect due to the big via may lead to excessive removal of portions of the passivation layer (e.g., a layer similar to the dielectric layer 140), such that portions of the FSG material therebelow may become exposed. The exposure of the FSG material (as a result of the conventional fabrication processes) leads to problems. For example, the fluorine may react with hydrogen (e.g., from water vapor) and form hydrofluoric acid (HF). The hydrofluoric acid may result in bubbles under additional passivation layers to be formed later. These passivation bubbles may cause passivation peeling and therefore render the semiconductor device defect.

Here, the dielectric layer 110A is formed using a fluorine-free material (e.g., USG). Therefore, even if the dielectric layer 140 (i.e., the passivation layer) is removed excessively due to the dishing effect discussed above, the exposure of the USG material would not cause passivation bubbles, since the USG material does not contain fluorine that would have reacted with hydrogen to form hydrofluoric acid. In addition, the formation of the big via 202 is carefully tuned so that the sidewall 230 of the big via 202 effectively blocks the FSG-containing dielectric layer component 80A to prevent its exposure. Stated differently, since the sidewall 230 spans across the boundary 250 between the dielectric layer components 110A and 80A, the FSG-containing dielectric layer component 80A is sealed in by both the fluorine-free dielectric layer component 110A and the big via 202. Thus, there is no concern of the fluorine in the dielectric layer 80A getting out to form passivation bubbles.

Figure 5:
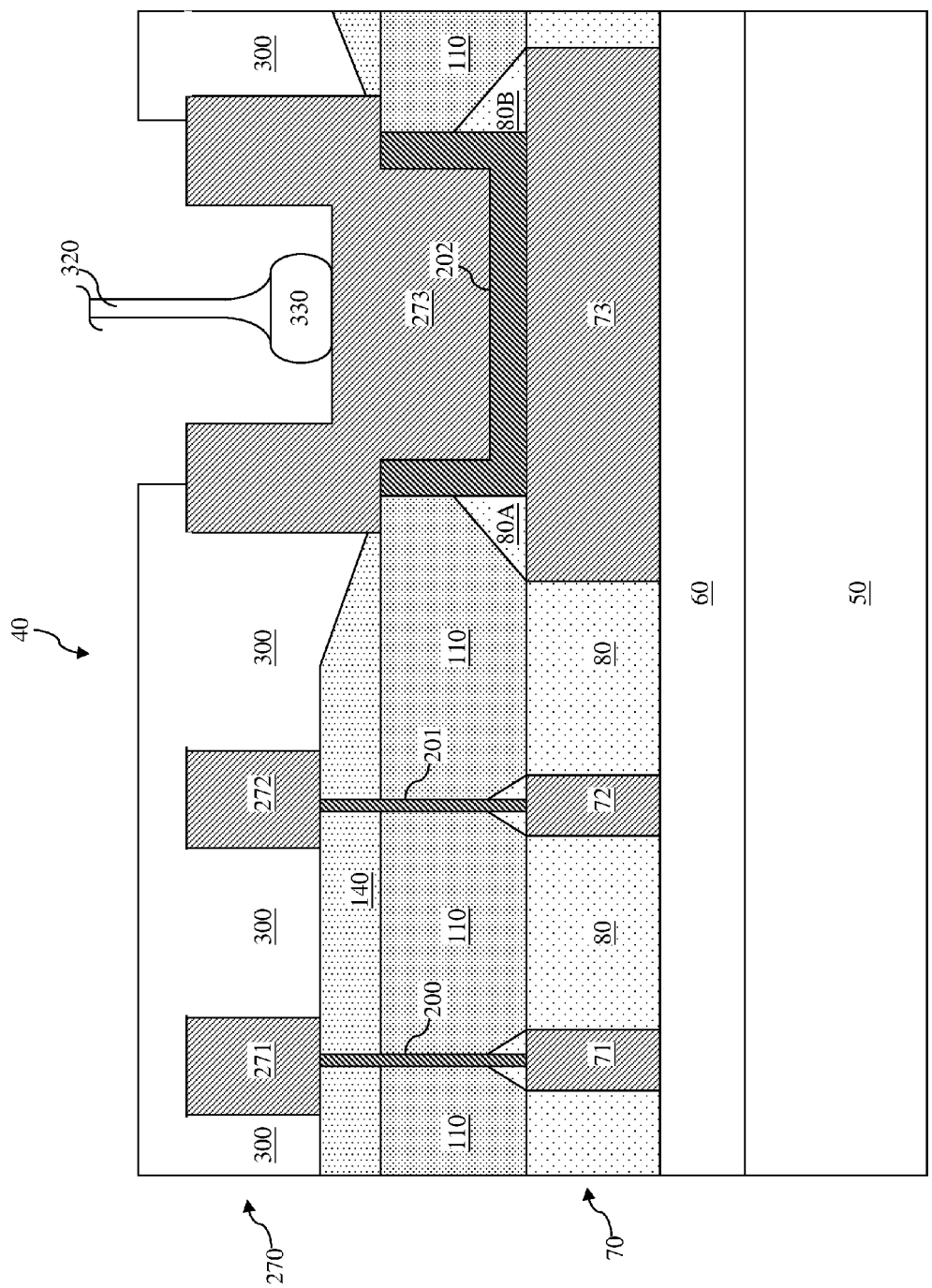

Referring now to FIG. 5, a metal layer 270 (of the interconnect structure) is formed over the dielectric layer 140 and over the vias 200-202. The metal layer 270 contains a plurality of metal components, of which metal components 271, 272, and 273 are illustrated herein as examples. The metal components 271-273 may include one or more metals or metal alloys, such as Aluminum or Copper alloys. In some embodiments, the metal components 271-273 contain Aluminum Copper (AlCu).

The metal components 71 and 271 are interconnected by the via 200, the metal components 72 and 272 are interconnected by the via 201, and the metal components 73 and 273 are interconnected by the big via 202. The metal layer 270 may be referred to as a top-level metal layer (or TM), and the metal layer 70 may be referred to as a top-level-minus-one metal layer (or TM−1). The vias 200-202 may be referred to as being in a top level via layer, though in certain embodiments the vias 200-202 may be considered as being in the top-level metal layer as well.

A passivation layer 300 is formed over the dielectric layer 140 and over the metal layer 270. The passivation layer 300 contains a suitable material that can provide good passivation for the various layers therebelow. A lithography process may then be performed to "open up" (or expose) the metal component 273. The exposed portion of the metal component 273 is then bonded to a bonding wire 320 using a wire bonding process known in the art. Thus, the top-level metal component 273 may also be referred to as a bonding pad. In some embodiments, the wire bonding process includes a ball bonding process, in which a portion of the bonding wire 320 is melted to form a bonding ball 330. In certain embodiments, the bonding wire 320 and the bonding ball 330 include gold. In other embodiments, the bonding wire 320 and the bonding ball 330 may include copper or another suitable metal.

Additional fabrication processes may be performed to complete the fabrication of the semiconductor device 40. For example, these additional fabrication processes may include packaging, wafer dicing/slicing, and testing processes. For the sake of simplicity, these additional processes are not described herein.

As discussed above, the embodiments of the present disclosure offers advantages, it being understood that different embodiments may offer different advantages, and not all the advantages are discussed herein, and that no particular advantage is required for all embodiments. One of the other advantages of certain embodiments of the present disclosure is that, by replacing an FSG material with an USG material, the embodiments disclosed herein prevents FSG exposure to hydrogen even if the CMP dishing effects as severe. If the passivation layer is excessively removed due to the severe CMP dishing effects, the exposed material underneath the passivation layer is USG, which is free of fluorine. Therefore, no hydrofluoric acid would be formed by the exposure of the USG material.

Another advantage of certain embodiments of the present disclosure is that the big via can be formed in a manner to effectively block the FSG material adjacent thereto. Specifically, by carefully adjusting the fabrication parameters, the big via can be formed to span across the interface between the USG and FSG components adjacent thereto. Thus, the FSG component is effectively sealed by the USG component and the sidewall of the big via. The location of the sidewall can be tuned by setting an appropriate overlay requirement between the big via and the metal component located in the TM−1 metal layer.

Other advantages of certain embodiments of the present disclosure pertain to the fact that the semiconductor device can be fabricated without incurring increased inter-metal dielectric thickness, and that the fabrication processes are still compatible with existing process flow and need only minimal changes.

It is understood that the various aspects of the present disclosure discussed above may be applied to the various technology nodes including the C011 node, the C014 node, the C015 node, the C0152 node, the C016 node, the C018 node, the C022 node, and the C025 node. It is also understood that the various aspects of the present disclosure discussed above may be used to fabricate a variety of devices that use Aluminum and Copper wire bonding, such as logic circuits, mixed mode circuits, radio-frequency circuits, and non-volatile memory circuits.

One of the broader forms of the present disclosure involves a semiconductor device. The semiconductor device includes: a first metal layer component formed over a substrate; a via formed over the first metal layer component, the via having a recessed shape; a second metal layer component formed over the via; a first dielectric layer component formed over the substrate, wherein the first dielectric layer component is located adjacent to, and partially over, the first metal layer component, and wherein the first dielectric layer component contains fluorine; and a second dielectric layer component formed over the first dielectric layer component, wherein the first dielectric layer component and the second dielectric layer component are each located adjacent to the via, and wherein the second dielectric layer component is free of fluorine.

In some embodiments, a sidewall of the via spans across a boundary between the first dielectric layer component and the second dielectric layer component.

In some embodiments, the boundary has a sloped cross-sectional profile.

In some embodiments, the first dielectric layer component contains fluorosilicate glass (FSG); and the second dielectric layer component contains undoped silicate glass (USG).

In some embodiments, the via is substantially centered over the first metal layer component; and a distance between an edge of the first metal layer component and a sidewall of the via is less than a predefined number.

In some embodiments, the first metal layer component, the second metal layer component, the first dielectric layer component, and the second dielectric layer component are parts of an interconnect structure.

In some embodiments, the semiconductor device further includes: a bonding wire formed over the second metal layer component.

In some embodiments, the second metal layer component belongs in a top-level metal layer; and the via belongs in a top-level via layer.

In some embodiments, the via is a first via, and further comprising a plurality of second vias formed in the top-level via layer, wherein a lateral dimension of the first via is at least multiple times greater than that of each of the second vias.

Another of the broader forms of the present disclosure involves a semiconductor device. The semiconductor device includes: a first metal layer formed over a substrate, the first metal layer containing a first metal feature and a first fluorosilicate glass (FSG) feature; a material layer formed over the first metal layer, the material layer containing a conductive via disposed on the first metal feature, a silicate glass (USG) feature, and a second FSG feature, wherein the USG feature and the second FSG feature forms an interface that intersects a sidewall of the conductive via at a non-right angle; and a second metal layer formed over the material layer, the second metal layer containing a second metal feature formed over the conductive via.

In some embodiments, the conductive via has a concave shape; the conductive via is approximately centered on the first metal feature; and the first metal feature is wider than the conductive via in a horizontal direction by a predetermined amount.

In some embodiments, the material layer contains a plurality of additional vias each substantially smaller than the conductive via in a horizontal direction.

In some embodiments, the interface between the USG feature and the second FSG feature intersects the sidewall of the conductive via at a point within a predetermined distance from a midpoint of the sidewall.

In some embodiments, the second metal layer is a top metal layer of an interconnect structure, and wherein the second metal feature contains at least one of Copper and Aluminum.

In some embodiments, the semiconductor device further includes a bonding wire bonded to the second metal feature.

Still another of the broader forms of the present disclosure involves a method of fabricating a semiconductor device. The method includes: forming, using a high-density plasma deposition process, a fluorosilicate glass (FSG) layer over and beside a metal component; forming, using a plasma-enhanced deposition process, an fluorine-free oxide layer over the FSG layer; etching an opening in a portion of the FSG layer located over the metal component; and forming a via in the opening and over the metal component in a manner such that a boundary between the oxide layer and the FSG layer intersects a sidewall of the via at a non-right angle.

In some embodiments, the method of claim further includes: forming an additional metal component on the via, wherein the additional metal component belongs to a top metal layer; and attaching a bonding wire to the additional metal component.

In some embodiments, the via is formed to be within a predetermined overlay with respect to the metal component.

In some embodiments, the forming the via includes performing a polishing process, and wherein the via has a recessed upper surface as a result of the polishing process.

In some embodiments, the forming the via including forming a plurality of additional vias that are substantially narrower than the via in a lateral dimension.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, the high voltage device may not be limited to an NMOS device and can be extended to a PMOS device with a similar structure and configuration except that all doping types may be reversed and dimensions are modified according to PMOS design. Further, the PMOS device may be disposed in a deep n-well pocket for isolating the device.

What is claimed is:

1. A semiconductor device, comprising:
a first metal layer component formed over a substrate;
a via formed over the first metal layer component, wherein the via has a first sidewall and an opposing second sidewall such that a recess extends from the first sidewall to the opposing second sidewall;
a second metal layer component formed over the via and within the recess;
a first dielectric layer component formed over the substrate, wherein the first dielectric layer component is located adjacent to, and partially over, the first metal layer component, and wherein the first dielectric layer component contains fluorine; and
a second dielectric layer component formed over the first dielectric layer component, wherein the first dielectric layer component and the second dielectric layer component are each located adjacent to the via, and wherein the second dielectric layer component is free of fluorine.

2. The semiconductor device of claim 1, wherein a third sidewall of the via spans across a boundary between the first dielectric layer component and the second dielectric layer component.

3. The semiconductor device of claim 2, wherein the boundary has a sloped cross-sectional profile.

4. The semiconductor device of claim 1, wherein:
the first dielectric layer component contains fluorosilicate glass (FSG); and
the second dielectric layer component contains undoped silicate glass (USG).

5. The semiconductor device of claim 1, wherein:
the via is substantially centered over the first metal layer component; and
a distance between an edge of the first metal layer component and a third sidewall of the via is less than a predefined number.

6. The semiconductor device of claim 1, wherein the first metal layer component, the second metal layer component, the first dielectric layer component, and the second dielectric layer component are parts of an interconnect structure.

7. The semiconductor device of claim 1, further comprising: a bonding wire formed over the second metal layer component.

8. The semiconductor device of claim 1, wherein:
the second metal layer component belongs in a top-level metal layer; and
the via belongs in a top-level via layer.

9. The semiconductor device of claim 8, wherein the via is a first via, and further comprising a plurality of second vias formed in the top-level via layer, wherein a lateral dimension of the first via is at least multiple times greater than that of each of the second vias.

10. A semiconductor device, comprising:
a first metal layer formed over a substrate, the first metal layer containing a first metal feature and a first fluorosilicate glass (FSG) feature;
a material layer formed over the first metal layer, the material layer containing a conductive via disposed on the first metal feature, a silicate glass (USG) feature, and a second FSG feature, wherein the USG feature and the second FSG feature forms an interface that intersects a first sidewall of the conductive via at a non-right angle, wherein the conductive via has a second sidewall and an opposing third sidewall such that a recess extends from the second sidewall to the opposing third sidewall; and
a second metal layer formed over the material layer, the second metal layer containing a second metal feature formed over the conductive via and within the recess.

11. The semiconductor device of claim 10, wherein:
the conductive via has a concave shape;
the conductive via is approximately centered on the first metal feature; and
the first metal feature is wider than the conductive via in a horizontal direction by a predetermined amount.

12. The semiconductor device of claim 10, wherein the material layer contains a plurality of additional vias each substantially smaller than the conductive via in a horizontal direction.

13. The semiconductor device of claim 10, wherein the interface between the USG feature and the second FSG feature intersects the sidewall of the conductive via at a point within a predetermined distance from a midpoint of the sidewall.

14. The semiconductor device of claim 10, wherein the second metal layer is a top metal layer of an interconnect structure, and wherein the second metal feature contains at least one of Copper and Aluminum.

15. The semiconductor device of claim 10, further comprising a bonding wire bonded to the second metal feature.

16. A semiconductor device comprising:
a fluorine containing dielectric layer component formed over a substrate,
a non-fluorine containing dielectric layer component formed over the fluorine containing dielectric layer component;
a first metal layer component embedded within the fluorine containing dielectric layer component;
a via embedded disposed over the first metal layer component and having opposing sidewall portions that define a recess within the via; and
a second metal layer component disposed within the recess of the via.

17. The semiconductor device of claim 16, wherein the fluorine containing dielectric layer component and the non-fluorine containing dielectric layer component both physically contact the via.

18. The semiconductor device of claim 16, wherein the second metal layer component is further disposed over and in physical contact with the non-fluorine containing dielectric layer.

19. The semiconductor device of claim 16, wherein the second metal layer component has opposing sidewall portions that define another recess.

20. The semiconductor device of claim 19, further comprising a bonding wire, and
wherein the second metal layer component is a bonding pad such that the bonding wire is disposed within the another recess and physically contacting the second metal layer component.

* * * * *